United States Patent [19]

Hasegawa

[11] Patent Number: 5,323,021
[45] Date of Patent: Jun. 21, 1994

[54] SEMICONDUCTOR INTEGRATED CIRCUIT DEVICE HAVING DIODE AND BIPOLAR TRANSISTOR HELD IN CONTACT THROUGH OXYGEN-LEAKAGE FILM WITH EMITTER ELECTRODE

[75] Inventor: Hidekazu Hasegawa, Tokyo, Japan

[73] Assignee: NEC Corporation, Tokyo, Japan

[21] Appl. No.: 63,212

[22] Filed: May 17, 1993

[30] Foreign Application Priority Data

May 22, 1992 [JP] Japan .................................. 4-130318

[51] Int. Cl.⁵ ........................ H01L 29/40; H01L 29/72
[52] U.S. Cl. ........................................ 257/37; 257/38; 257/588; 257/751; 257/756
[58] Field of Search ............... 257/754, 756, 584, 587, 257/588, 591, 37, 38, 39, 751; 437/162

[56] References Cited

U.S. PATENT DOCUMENTS

| | | | |
|---|---|---|---|
| 4,672,413 | 6/1987 | Gardner | 257/38 |
| 5,028,973 | 7/1991 | Bajor | 257/593 |
| 5,272,357 | 12/1993 | Morishita | 257/587 |

OTHER PUBLICATIONS de Graaff et al., The SIS Tunnel Emitter: A Theory for Emitters with Thin Interfacial Layers, IEEE Trans. on Electron Devices, vol. Ed-26, No. 11, Nov. 1979, pp. 1771-1776.

Primary Examiner—Rolf Hille
Assistant Examiner—Peter Toby Brown
Attorney, Agent, or Firm—Whitham, Curtis & Whitham

[57] ABSTRACT

A bipolar transistor and a diode are incorporated in a semiconductor integrated circuit device, and an emitter electrode is constituted by lower and upper doped polysilicon films sandwiching an oxygen-leakage film which tunnels minority carriers of the base therethrough at higher probability than the majority carriers so as to enhance the emitter injection efficiency, thereby allowing a designer to increase the base width and the distance from the p-n junction between the anode and the cathode for improving the breakdown voltage of the diode without sacrifice of the current amplification factor.

5 Claims, 3 Drawing Sheets

SEMICONDUCTOR INTEGRATED CIRCUIT DEVICE HAVING DIODE AND BIPOLAR TRANSISTOR HELD IN CONTACT THROUGH OXYGEN-LEAKAGE FILM WITH EMITTER ELECTRODE

FIELD OF THE INVENTION

This invention relates to a semiconductor integrated circuit device and, more particularly, to a semiconductor integrated circuit device having a diode and a bipolar transistor held in contact with an oxygen-leakage film with the emitter electrode.

DESCRIPTION OF THE RELATED ART

A typical example of the semiconductor integrated circuit device is illustrated in FIG. 1 of the drawings, and the structure of the semiconductor integrated circuit device is described through a process sequence for fabrication thereof. The process sequence starts with preparation of a p-type silicon substrate 1, and heavily doped n-type buried layers 2 are formed in the surface portion of the p-type silicon substrate 1. An n-type silicon layer 3 is epitaxially grown on the p-type silicon substrate 1 and on the heavily doped n-type buried layers 2. P-type isolation regions 4 are formed in the n-type silicon layer 3, and reach the p-type silicon substrate 1. A thick field oxide film 5a is selectively grown over the p-type isolation regions 4, and thin oxide films 5b cover the n-type silicon layer 3. The p-type isolation regions 4, the thick field oxide film 5 and the p-type silicon substrate 1 define active device regions where a bipolar transistor and a diode are fabricated.

An appropriate mask (not shown) is patterned through a lithographic process, and p-type impurity atoms are ion-implanted through the mask into the active device regions. Then, lightly doped p-type regions are formed in the active device regions, respectively, and the lightly doped p-type regions respectively serve as a base 6a and an anode 6b. The lithographic process is repeated for another mask (not shown), and heavily doped p-type impurity regions are respectively formed in the lightly doped p-type regions 6a and 6b through the ion-implantation technique for providing a graft base 7a and an anode contact region 7b.

An appropriate mask (not shown) is patterned on the thin oxide films 5b, and the thin oxide films 5b are partially etched away so as to form windows for an emitter, a collector contact, a cathode and an anode contact. A polysilicon film is deposited over the entire surface of the structure to a thickness of 450 nanometers by using a low-pressure chemical vapor deposition process, and arsenic atoms are ion-implanted therein at 70 KeV. The resultant structure is placed in high temperature ambience at 1000 degrees in centigrade, and the arsenic atoms are diffused from the polysilicon film into the n-type silicon layer 3 so that heavily doped n-type impurity regions are formed in the n-type silicon layer 3. The heavily doped n-type impurity regions thus formed serve as an emitter region 8a, a collector contact region 8b, a cathode region 8c and an anode contact region 8d. The polysilicon film thus serving as the diffusion source is, then, patterned through a lithographic process followed by an etching stage, and doped polysilicon blocks 9 are left on the emitter region 8a, the collector contact region 8b, the cathode region 8c and the anode contact region 8d which are electrically isolated from one another.

A phospho-silicate glass film 10 is deposited over the entire surface of the structure to thickness of 500 nanometers by using a normal chemical vapor deposition process, and an appropriate mask is patterned through the lithographic process. Using the mask, contact holes are formed in the phospho-silicate glass film 10 through an etching, and reach the graft base 7a, the doped polysilicon blocks 9 and the anode contact region 7b, respectively.

An aluminum film is sputtered on the entire surface of the structure, and is patterned through an etching so that a base electrode 11a, an emitter electrode 11b, a collector electrode 11c and both electrodes 11d and 11e of the diode are produced from the aluminum film.

Although the diode is similar in structure to the bipolar transistor, the heavily doped anode contact region 7b is electrically conducted through the electrode 11e and the doped polysilicon block 9 with the anode contact region 8d, and the short-circuit through the electrode 11e allows the device to achieve the rectification only.

The prior art process sequence concurrently fabricates the bipolar transistor and the diode, and is desirable for an integrated circuit device with bipolar transistors and diodes. However, a problem is encountered in either current amplification factor or breakdown voltage of the diode. In detail, the current amplification factor of a bipolar transistor is given as the product of the emitter injection efficiency and the base transport factor of the bipolar transistor, and the base transport factor is inversely proportional to the base width or the distance between the emitter and the collector. Therefore, it is desirable for the bipolar transistor to be decreased in the base width, and the n-type impurity atoms should be deeply diffused from the doped polysilicon film into the lightly doped p-type region 6a so as to decrease the base width. On the other hand, the breakdown voltage of a diode takes place in the depletion layer extending from the p-n junction between the anode and the cathode, and becomes larger together with the thickness of the depletion layer. Therefore, it is desirable for the diode that the anode and the cathode are wide enough to allow the depletion layer to freely extend, and the n-type impurity atoms should not be diffused deeply into the lightly doped p-type impurity region 6b. In fact, if the bipolar transistor achieves the current amplification factor of 100, the breakdown voltage of the diode is around 5.2 volts. However, if the current amplification factor is decreased to 80, the breakdown voltage is increased to 6.0 volts. Thus, there is a trade-off between the bipolar transistor and the breakdown voltage, and the prior art integrated circuit device suffers from low production yield if the design specification requests the current amplification factor more than 80 as well as the breakdown voltage more than 5.0 volts.

SUMMARY OF THE INVENTION

It is therefore an important object of the present invention to provide a semiconductor integrated circuit device which concurrently achieves a large current amplification factor as well as a large breakdown voltage.

To accomplish the object, the present invention proposes to increase the base transport factor by allowing minority carriers of a base region to tunnel through a silicon-insulator-silicon structure.

In accordance with the present invention, there is provided a semiconductor integrated circuit device fabricated on a semiconductor substrate structure, comprising: a) a bipolar transistor formed in a first active device area of the semiconductor substrate structure, and having a-1) a collector of a first conductivity type, a-2) a base of a second conductivity type opposite to the first conductivity type, a first p-n junction being produced between the collector and the base, a-3) an emitter of the first conductivity type forming a second p-n junction with the base, and a-4) an emitter electrode held in contact with the emitter, and having a first lower doped polysilicon film, a first upper doped polysilicon film and a first insulating film sandwiched between the first lower silicon film and the first upper silicon film, the first insulating film allowing minority carriers in the base to tunnel therethrough at higher probability rather than majority carriers in the base for enhancing emitter injection efficiency; and b) a diode formed in a second active device area of the semiconductor substrate structure isolated from the first active device area, and having b-1) one of an anode and a cathode having the second conductivity type, and forming a third p-n junction together with the semiconductor substrate structure, and b-2) the other of the anode and the cathode of the first conductivity type formed in the aforesaid one of the anode and the cathode, and forming a fourth p-n junction together with the anode.

BRIEF DESCRIPTION OF THE DRAWINGS

The features and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 1:
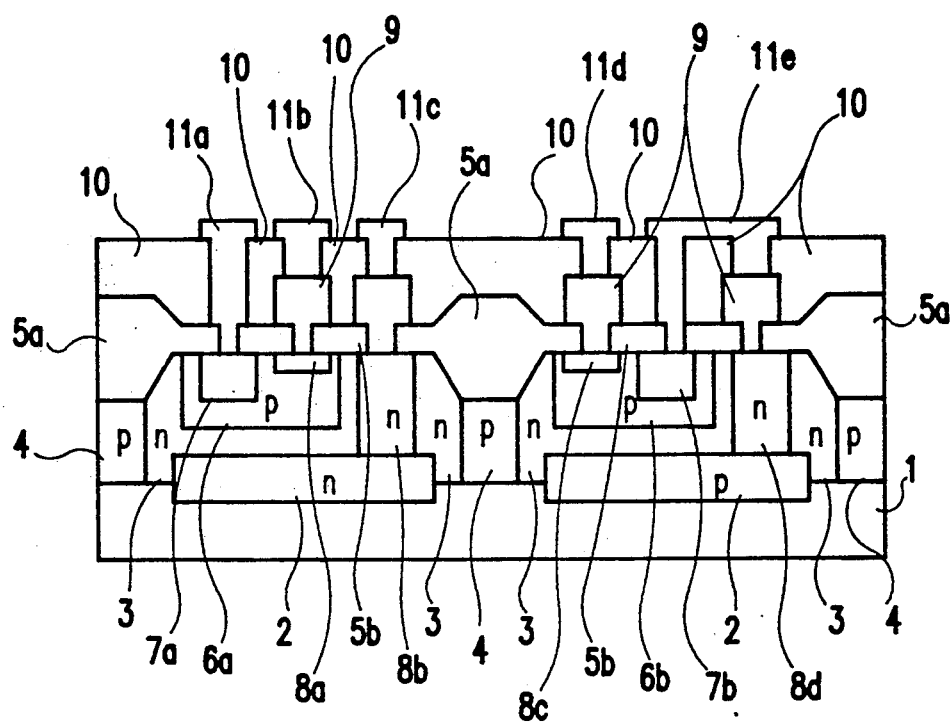
FIG. 1 is a cross sectional view showing the structure of the prior art semiconductor integrated circuit device.
Figure 2:
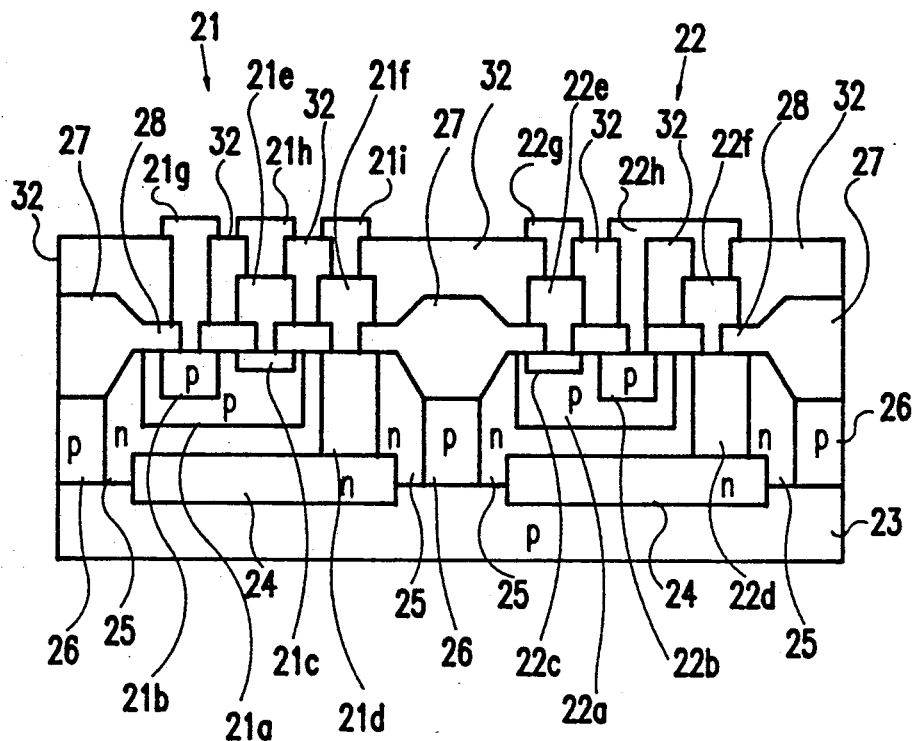
FIG. 2 is a cross sectional view showing the structure of a semiconductor integrated circuit device according to the present invention.

Referring to FIG. 2 of the drawings, a bipolar transistor 21 and a diode 22 are incorporated in a semiconductor integrated circuit device embodying the present invention, and the semiconductor integrated circuit device is fabricated on a lightly doped p-type silicon substrate 23. Although other circuit components are further integrated in the semiconductor integrated circuit device, description is focused upon the bipolar transistor 21 and the diode 22, and the structures are described through a process sequence as similar to the prior art semiconductor integrated circuit device.

The process sequence starts with preparation of the lightly doped p-type silicon substrate 23, and heavily doped n-type buried layers 24 are formed in a surface portion of the lightly doped p-type silicon substrate 23. An n-type silicon layer 25 is epitaxially grown in such a manner as to cover the lightly doped p-type silicon substrate 23 and the heavily doped n-type buried layers 24. P-type isolation regions 26 are formed in the n-type epitaxial silicon layer 25, and reach the lightly doped p-type silicon substrate 23. A thick field oxide film 27 is selectively grown over the p-type isolation regions 26, and thin silicon oxide films 28 are concurrently grown to cover the n-type epitaxial silicon layer 25. The p-type isolation regions 26, the thick field oxide film 27 and the p-type silicon substrate 23 define active device regions where the bipolar transistor 21 and the diode 22 are fabricated. The lightly doped p-type silicon substrate 23, the heavily doped n-type buried layers 24, the lightly doped n-type epitaxial layer 25 and the p-type isolation regions as a whole constitute a semiconductor substrate structure.

An appropriate mask (not shown) is patterned over the thin silicon oxide films 28 through a lithographic process, and p-type impurity atoms are ion-implanted through the mask into the active device regions. Then, lightly doped p-type regions are formed in the active device regions, respectively, and these lightly doped p-type regions respectively serve as a base region 21a and an anode region 22a. The lithographic process is repeated for another mask (not shown), and a heavily doped p-type graft base region 21b and a heavily doped p-type anode contact region 22b are respectively formed in the lightly doped p-type base region 21a and the anode region 22a through the ion-implantation.

The mask is stripped off, and an appropriate mask (not shown) is patterned on the thin silicon oxide films 28 again. Using the mask, the thin silicon oxide films 28 are partially etched away so as to form windows for an emitter, a collector contact, a cathode and an anode contact.

Polysilicon is deposited to a thickness of 10 nanometers by using a low-pressure chemical vapor deposition process, and a lower polysilicon film 29 fills the contact windows. In the deposition stage of polysilicon, silane ($SiH_4$) gas is introduced and decomposed in a reactor (not shown) where the lightly doped silicon substrate 23 is placed. When the lower polysilicon film 29 reaches 10 nanometers, oxygen is leaked into the reactor, and the lower polysilicon film 29 is overlaid by an oxygen-leakage film 30. The oxygen-leakage film 30 is of silicon oxide, and is as thin as 2 nanometers. Since the oxygen slows down the deposition, the thickness of the oxygen-leakage film 30 is controllable The oxygen is, then, stopped, and an upper polysilicon film 31 is deposited to 440 nanometers thick through pyrolysis of silane. Arsenic atoms are ion-implanted into the multi-layer structure consisting of the lower polysilicon film 29, the oxygen-leakage film 30 and the upper polysilicon film 31 at 70 KeV. The arsenic atoms reach the lower polysilicon film 29, and are diffused into the p-type base region 21a, the n-type epitaxial silicon layer 25 and the p-type anode region 22a at 1000 degrees in centigrade. The arsenic atoms thus diffused form an emitter region 21c, a collector contact region 21d, a cathode 22c and an anode contact region 22d.

Figure 3:
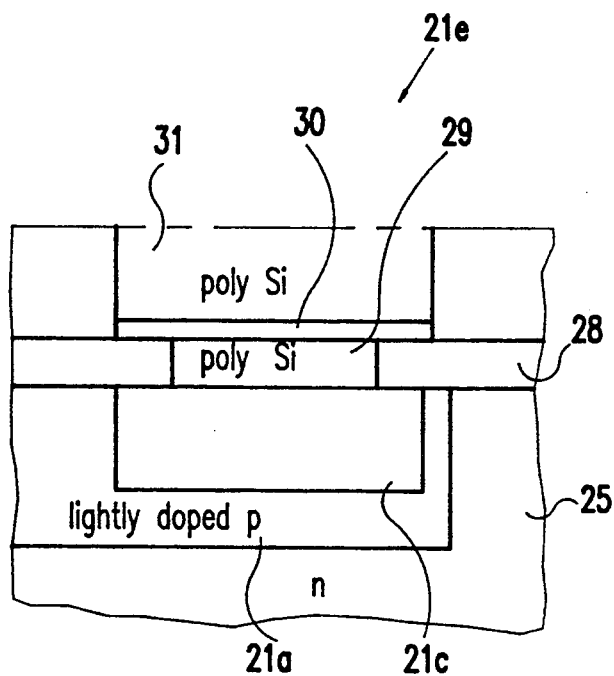
FIG. 3 is a cross sectional view showing, in an enlarged scale, the emitter structure of a bipolar transistor incorporated in the semiconductor integrated circuit device.

Thereafter, the lower and upper polysilicon film 29 and 31 sandwich the oxygen-leakage film 30 are patterned through a lithographic process followed by an etching stage, and SIS (Silicon-Insulator-Silicon) structures 21e, 21f, 22e and 22f take place on the emitter region 21c, the collector contact region 21d, the cathode region 22c and the anode contact region 22d. The SIS structure 21e over the emitter region 21c is illustrated in FIG. 3 in an enlarged scale. The SIS structure 21e and the emitter region 21c as a whole constitute a tunnel emitter disclosed in IEEE Transaction on Electron Devices, vol. ED-26, No. 11. November 1979, pages 1771 to 1776. According to the IEEE paper, an electron is ten times to hundreds of times larger in tunneling probability than holes in the SIS structure. As a result, the tunnel emitter enhances the emitter injection efficiency, and decreases the temperature dependency of the current amplification factor.

A phospho-silicate glass film 32 is deposited over the entire surface of the structure to a thickness of 500 nanometers by using a normal chemical vapor deposition process, and an appropriate mask is patterned through the lithographic process. Using the mask, contact holes are formed in the phospho-silicate glass film 32 through an etching, and reach the graft base 21b, the SIS structures 21e, 21f, 22e and 22f and the anode contact region 22b, respectively.

An aluminum film is sputtered on the entire surface of the structure, and is patterned through an etching so that a base electrode 21g, an emitter electrode 21h, a collector electrode 21i and both electrodes 22g and 22h of the diode 22 are produced from the aluminum film.

The present inventor confirmed the range of effective thickness for the oxygen-leakage film 30. According to the experimental result, if the oxygen-leakage film 30 ranged from 1 nanometer to 3 nanometers thick, the minority carriers of the base tunneled therethrough at higher probability than the majority carriers of the base, and kept the current amplification factor against the increased base width.

As will be appreciated from the foregoing description, the SIS structure 21e enhances the emitter injection efficiency, and gives a device designer a margin of the base transport factor. This means that the device designer makes the emitter region 21c shallow. As a result, the distance between the shallow regions 21c and 22c the lightly doped n-type epitaxial layer 25 is increased. For this reason, the semiconductor integrated circuit device according to the present invention achieves a large breakdown voltage without sacrifice of the current amplification factor of the bipolar transistor 21.

Second Embodiment

Figure 4:
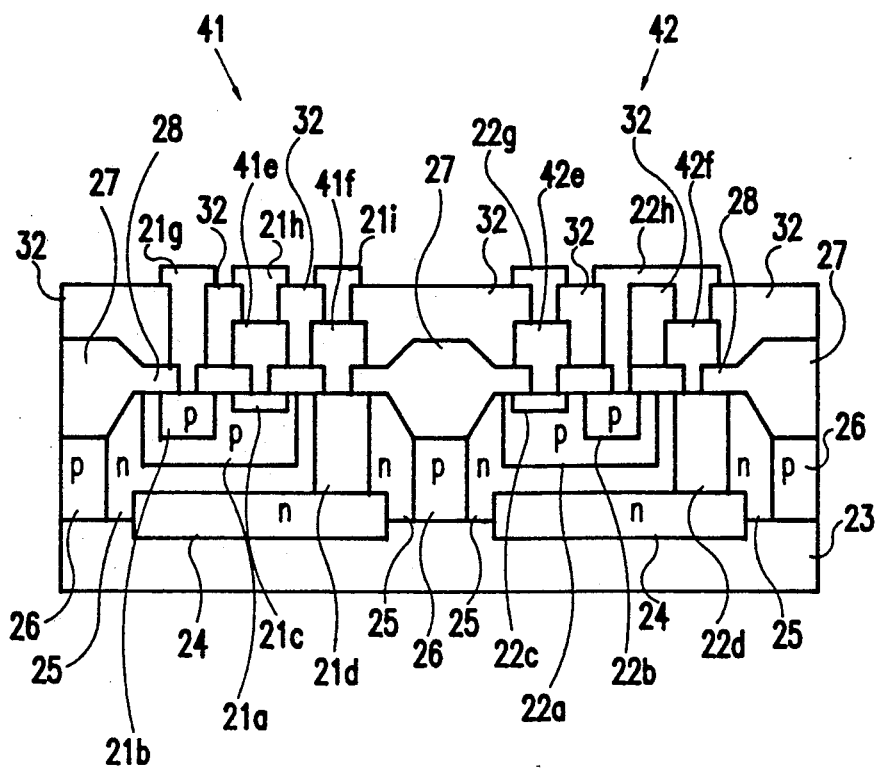
FIG. 4 is a cross sectional view showing the structure of another semiconductor integrated circuit device according to the present invention.

Turning to FIG. 4, another semiconductor integrated circuit device embodying the present invention comprises a bipolar transistor 41 and a diode 42, and the bipolar transistor 41 and the diode 42 are similar to the bipolar transistor 21 and the diode 22 except for SIS structures 41e, 41f, 42e and 42f. For this reason, the other components are labeled with the same references used for the first embodiment. The SIS structures 41e, 41f, 42e and 42f are similar to one another, and description is made on the SIS structure 41e over the emitter region 21c.

Figure 5:
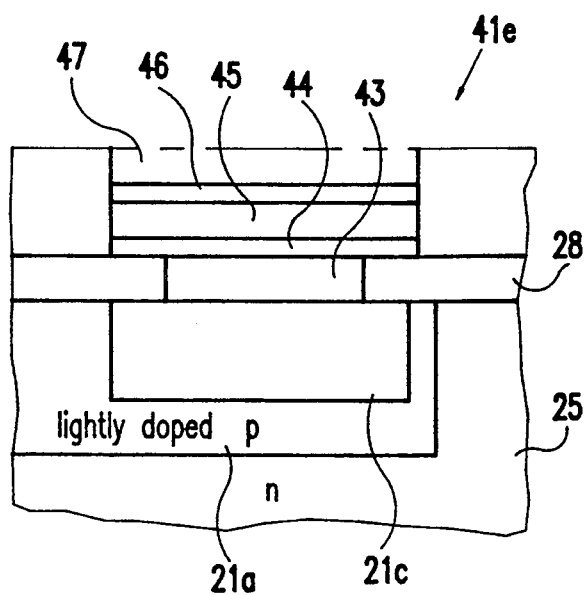
FIG. 5 is a cross sectional view showing, in an enlarged scale, the emitter structure of a bipolar transistor incorporated in the semiconductor integrated circuit device shown in FIG. 4.

As will be better seen from FIG. 5, the SIS structure 41e comprises a lower doped polysilicon film 43, a lower oxygen-leakage film 44, an intermediate doped polysilicon film 45, an upper oxygen-leakage film 46 and an upper doped polysilicon film 47.

In a fabrication process for the bipolar transistor 41 and the diode 42, contact holes are formed in the thin silicon oxide film 28 as similar to the first embodiment, and a low-pressure chemical vapor deposition is applied as follows. Silane gas is introduced into a reactor (not shown), and a lower polysilicon layer is deposited to a thickness of 10 nanometers. Oxygen gas is leaked into the reactor, and is mixed with the silane. Then, a lower oxygen-leakage layer of 2 nanometers thick covers the lower polysilicon layer. The oxygen gas is stopped, and the silane gas is continuously supplied to the reactor. Then, an intermediate polysilicon layer is deposited over the lower oxygen-leakage layer to a thickness of 200 nanometers. Oxygen gas is leaked into the reactor again, and an upper oxygen-leakage layer of 2 nanometers thick covers the intermediate polysilicon layer. The oxygen gas is stopped again, and an upper polysilicon layer is deposited over the upper oxygen-leakage layer to a thickness of 240 nanometers. The lower polysilicon layer is held in contact through the contact holes with the p-type base region 21a, the n-type epitaxial silicon layer 25 and the anode region 22a, and the lower, intermediate and upper polysilicon layers and the lower and upper oxygen-leakage layers form in combination a multi-layer structure.

Arsenic atoms are ion-implanted into the multi-layer structure, and the arsenic atoms are diffused from the lower polysilicon layer so as to form the emitter region 21c, the collector contact region 21d, the cathode region 22c and the anode contact region 22d. The multi-layer structure is, thereafter, patterned into the SIS structures 41e, 41f, 42e and 42f. The process sequence for the second embodiment is similar to that of the first embodiment except for the above described formation of the SIS structures 41e, 41f, 42e and 42f, and no further description is incorporated hereinbelow for avoiding repetition.

In this instance, the SIS structure 41e has two oxygen-leakage films between the doped polysilicon films, and, for this reason, the emitter region 21c and the cathode region 22c become shallower than those of the first embodiment.

The present inventor also confirmed effective range of the thickness for the lower and upper oxygen-leakage layers. If both of the lower and upper oxygen-leakage layers fall within the range from 1 nanometer to 3 nanometers thick, the SIS structure 41e was effective against increase of the base width. In fact, the bipolar transistor 41 and the diode 42 achieved the current amplification factor of 140 and the breakdown voltage of 5.0 volts, and another product achieved the current amplification factor of 80 and the breakdown voltage of 6.9 volts. Comparing these device characteristics with those of the prior art, the semiconductor integrated circuit device according to the present invention improves one of the current amplification factor and the breakdown voltage without sacrifice of the other. This results in high production yield. When a design specification requests the current amplification factor more than 80 and the breakdown voltage more than 5 volts, the production yield is surely increased.

Although particular embodiments of the present invention have been shown and described, it will be obvious to those skilled in the art that various changes and modifications may be made without departing from the spirit and scope of the present invention. For example, the anode region and the cathode regions are exchangeable, and donor impurities and acceptor impurities are also exchangeable for the bipolar transistor and the diode.

What is claimed is:

1. A semiconductor integrated circuit device fabricated on a semiconductor substrate structure, comprising:
   a) a bipolar transistor formed in a first active device area of said semiconductor substrate, and having
   a-1) a collector of a first conductivity type,
   a-2) a base of a second conductivity type opposite to said first conductivity type, a first p-n junction being produced between said collector and said base,
   a-3) an emitter of said first conductivity type forming a second p-n junction with said base, and
   a-4) an emitter electrode held in contact with said emitter, and having a first lower doped polysilicon film, a first upper doped polysilicon film and a first insulating film sandwiched between said first lower doped polysilicon film and said first upper doped polysilicon film, said first insulating film allowing minority carriers in said base to tunnel therethrough at higher probability than majority carriers in said base for enhancing emitter injection efficiency; and
   b) a diode formed in a second active device area of said semiconductor substrate structure isolated from said first active device area, and having
   b-1) one of an anode and a cathode having said second conductivity type, and forming a third p-n junction together with said semiconductor substrate structure, and
   b-2) the other of said anode and said cathode of said first conductivity type formed in said one of said anode and said cathode, and forming a fourth p-n junction together with said one of said anode and said cathode.

2. A semiconductor integrated circuit device as set forth in claim 1, in which said diode further has an electrode held in contact with said one of said anode and said cathode, said electrode of said diode being constituted by a second lower doped polysilicon film, a second upper doped polysilicon film and a second insulating film sandwiched between said second lower doped polysilicon film and said second upper doped polysilicon film, said first and second lower polysilicon films, said first and second upper polysilicon films and said first and second insulating films being respectively formed from a lower doped polysilicon layer, an upper doped polysilicon layer and an insulating layer, and said emitter and said one of said anode and said cathode formed from impurity atoms of said first conductivity type diffused from said lower doped polysilicon layer.

3. A semiconductor integrated circuit device as set forth in claim 2, in which said insulating layer ranges from 1 nanometer to 3 nanometer thick.

4. A semiconductor integrated circuit device as set forth in claim 2, in which said emitter electrode and said electrode of said diode further have respective upper insulating films respectively covering said first and second upper doped polysilicon films, and respective uppermost doped polysilicon films respectively covering said upper insulating films.

5. A semiconductor integrated circuit device as set forth in claim 4, in which said upper insulating films range from 1 nanometer to 3 nanometers thick.

* * * * *